United States Patent [19]
Abt et al.

[11] Patent Number: 5,292,402
[45] Date of Patent: Mar. 8, 1994

[54] MASKING MATERIAL FOR APPLICATIONS IN PLASMA ETCHING

[75] Inventors: Norman E. Abt, Burlingame; Sheldon Aronowitz, San Jose, both of Calif.

[73] Assignee: National Semiconductor Corporation, Santa Clara, Calif.

[21] Appl. No.: 910,951

[22] Filed: Jul. 9, 1992

[51] Int. Cl.$^5$ .............................................. H01L 21/00
[52] U.S. Cl. ................................. 156/659.1; 156/643; 156/646; 156/661.1; 156/660; 156/667; 156/653; 252/79.3; 148/DIG. 106
[58] Field of Search ..................... 156/643, 646, 659.1, 156/660, 661.1, 662, 653, 667; 148/DIG. 106; 252/79.3, 79.1

[56] References Cited

U.S. PATENT DOCUMENTS

| | | | |
|---|---|---|---|
| 4,759,823 | 7/1988 | Asselanis et al. | 156/659.1 |
| 5,028,455 | 7/1991 | Miller et al. | 427/126.3 |
| 5,116,643 | 5/1992 | Miller et al. | 437/234 |

OTHER PUBLICATIONS

Burfoot et al, "Polar Dielectrics and their Applications," University of California Press Berkeley and Los Angeles, 1978, pp. 21-25.

Curran, "Physical and Chemical Etching in Plasmas," Elsevier Sequoia/Printed in The Netherlands, Mar. 25, 1981.

Poor et al, "Measurements of Etch Rate and Film Stoichiometry Variations During Plasma Etching of Lead-Lanthanum-Zirconium-Titanate Thin Films," 1991 American Institute of Physics, pp. 3385-3387.

Primary Examiner—Brian E. Hearn
Assistant Examiner—George Goudreau
Attorney, Agent, or Firm—Skjerven, Morrill, MacPerson, Franklin & Friel

[57] ABSTRACT

Materials of the lead perovskite family $PbZr_xTi_{1-x}O_3$ have been discovered to be excellent masking materials in the etching of silicon and silicon-containing materials with chlorine and fluorine -based plasmas. Generally, materials of the lead perovskite family are suitable masking materials for any material that is etched in chlorine and fluorine -based plasmas.

9 Claims, 2 Drawing Sheets

MASKING MATERIAL FOR APPLICATIONS IN PLASMA ETCHING

BACKGROUND OF THE INVENTION

1. Field of the Invention

The present invention relates to masking materials for use in plasma etching, and more particularly to masking materials for applications in plasma etching of silicon and silicon-containing materials using chlorine and fluorine -based plasmas.

2. Description of Related Art

Plasma etching techniques using species produced from chemically inert and chemically active gases have many industrial uses, including notably in the fabrication of integrated circuits. Chemical plasma etching equipment includes barrel etchers, parallel plate etchers, and reactive ion etchers. Chemical plasma etching processes rely exclusively or to a substantial degree on excited gas species that are suitable for reacting chemically with the material to be etched, although in some cases sputtering of the masking material and/or material being etched can occur depending on the molecular weight of the impinging gas and the molecular weight of the material exposed to the impinging gas. For example, chloride-based and fluorine-based plasmas have been successfully used in the etching of photoresist-masked silicon, silicon dioxide, silicon nitride, aluminum and tungsten.

Patterned plasma etching involves the use of a masking material having a significantly slower etch rate in the plasma than the etch rate of the material being etched. Masking material should also be easy to apply and distribute across the material being etched, and easy to strip after etching is complete. Unfortunately, the photoresist masking material in common use in the semiconductor industry is subject to chemical attack by chlorine-based and fluorine-based plasmas. While erosion of the masking material is tolerable in many process applications, the erosion is excessive in such applications as deep trench fabrication requiring lengthy exposure of the wafer to the plasma. Hence, a masking material that can be readily applied and distributed across a wafer or other body and easily patterned and easily stripped, but that is relatively impervious to certain commonly used plasmas is desirable.

SUMMARY OF THE INVENTION

Masking films formed from materials of the lead perovskite family are particularly useful in plasma etching by fluorine-based or chlorine-based plasmas. Such films are chemically inactive with such plasmas, mill slowly, can be easily applied using gel material, and are easily patterned.

DESCRIPTION OF THE PREFERRED EMBODIMENT

Figure 1:
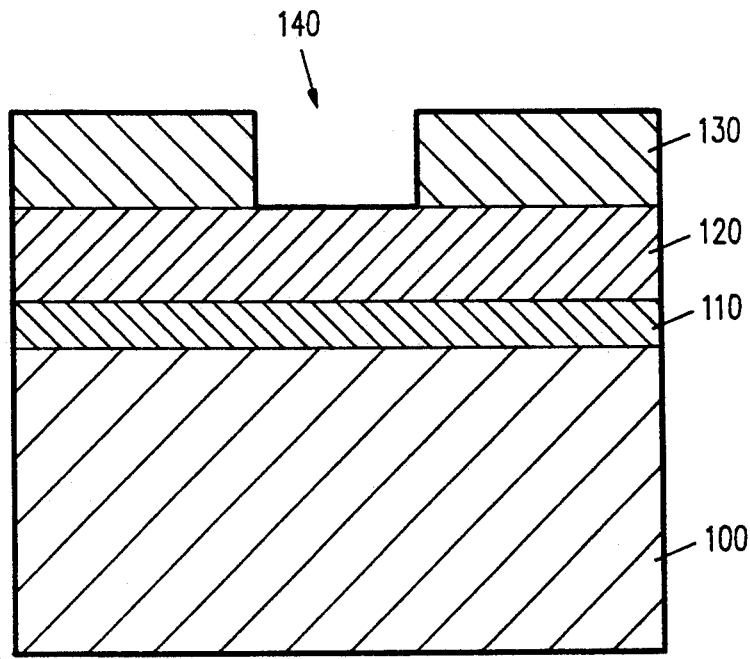
FIGS. 1, 2, 3 and 4 are cross-sections showing in progression a deep trench etch process in accordance with the present invention.

Materials of the lead perovskite family $PbZr_xTi_{1-x}O_3$, in which the value of X varies from zero to one, have been discovered to be excellent masking materials in the etching of silicon and silicon-containing materials with chlorine and fluorine-based plasmas. Generally, materials of the lead perovskite family are suitable masking materials for any material that is etched in chlorine and fluorine -based plasmas such as, for example, plasmas derived from such gases as $CCl_4$, $CF_4$, $SF_6$, $CHF_3$, $C_2F_6$, and $Cl_2$. It is believed that the lead constitutient of the lead perovskite material contributes significantly to the etch-resistive properties. The lead perovskite material may include dopants (concentration less than about five 0 atomic percent) or modifiers (concentration greater than about five atomic percent). The most common dopants or modifiers for materials of the lead perovskite family are bismuth (Bi), iron (Fe), niobium (Nb), tin (Sn), and lanthanum (La), although other materials may also be used. See, e.g., Burfoot and Taylor, Polar Dielectrics and Their Applications, University of California Press, 1979, pp. 23–34.

The etch-resistant properties of materials of the lead perovskite family were observed in various plasmas over the course of several experiments in which the value X, the plasma pressure, and the plasma temperature were varied. Some experiments were performed using a model Lam 490 plasma reactor, manufactured by and available from Lam Research. The electrode spacing and diameter were constant for the experiments, with the spacing being 1.0 centimeters and the diameter being 150 millimeters. The power applied was 220 watts for two minutes. The substrate temperature was maintained at 27° C. The etch gas was a mixture of $CCl_4$ and He, introduced at a flow rate of 80 SCCM and 40 SCCM respectively. The inlet pressure was maintained at 150 millitorr. The value of X in these experiments was 0.4 and 0.5. The samples were monitored for their chemical etch and sputter etch performance. No chemical etch was observed, and low sputter etch was observed.

Other samples were etched using argon in a Perkin-Elmer 4400 series sputter etcher for ten minutes, at one thousand volts and ten milliTorr. The samples were monitored for their sputter etch performance. Low sputter etch was observed.

The observed behavior reported above is consistent with results published in the literature for studies of materials of the lead perovskite family. The resistance to ion milling of a material of the lead perovskite family doped with lanthanum, hereinafter referred to as PLZT, is reported by J. E. Curran in "Physical and Chemical Etching in Plasmas," a paper presented at the International Seminar on Film Preparation and Etching by Plasma Technology, Brighton, Great Britain, Mar. 25, 1981. As reported in Table 1 of the Curran paper, PLZT ion mills at about one-third of the silicon dioxide ion mill rate and at about one-half of the photoresist ion mill rate. More recently, M. R. Poor and C. B. Fleddermann report in "Measurements of etch rate and film stoichiometry zirconium-titanate thin films," J. Appl. Phys. 70, 3385 (1991) that while plasmas generated from $CF_4$ or a $CF_4/HCl/He$ mixture have some milling and, under some circumstances, chemical effect on lead-lanthanum-zirconium-titanates and lead-lanthanum-titanates, the films are essentially unscathed at room temperature.

A particularly suitable initial form for semiconductor fabrication purposes of materials of the lead perovskite family is a sol-gel, the fabrication of which is fully disclosed in U.S. Pat. No. 5,028,455, issued Jul. 2, 1991 to Miller et al., and is hereby incorporated herein by reference.

Because of their resistance to erosion in chlorine-based and fluorine-based plasmas, materials of the lead perovskite family are generally useful in the plasma etching of silicon and silicon-containing materials, and are particularly useful in the plasma etching of trenches and especially deep trenches in silicon and silicon-containing materials. An illustrative process for deep trench formation in a silicon substrate is shown in FIGS. 1-4. A thin layer of a suitable barrier material such as oxide 110 is grown or deposited on a silicon wafer 100 to a thickness sufficient to prevent contamination from lead. Illustratively, a thermal oxide thickness in the range of about 500Å to 2000Å is suitable. PLZT material in preferably sol-gel form is spun onto the wafer using standard spin-on techniques. The wafer is baked to drive off the solvent in the sol-gel and form a layer 120 of a suitable thickness. Illustratively, a bake at 400 degrees Centigrade for 1 minute is suitable, and a PLZT thickness of about 0.3 micron is suitable. The PLZT layer 120 is masked with a conventional photoresist layer 130.

Figure 2:
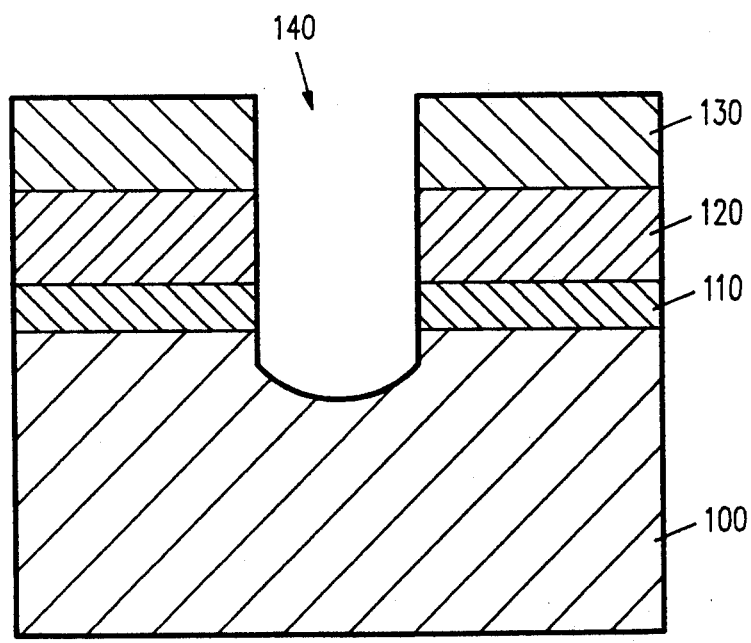

Refer now to FIG. 2. The PLZT layer 120 is etched through window 140 in the resist layer 130 using any suitable etchant. For example, hydrogen fluoride (HF) and hydrogen chloride (HCl) dips are suitable. The same etchant or, if desired, a different etchant is used to remove portions of the silicon dioxide layer is within the window 140. Some of the substrate 100 may be etched as well. The photoresist 130 is stripped using any suitable technique. Illustratively, the photoresist 130 is stripped using oxygen ($O_2$) ashing.

Figure 3:
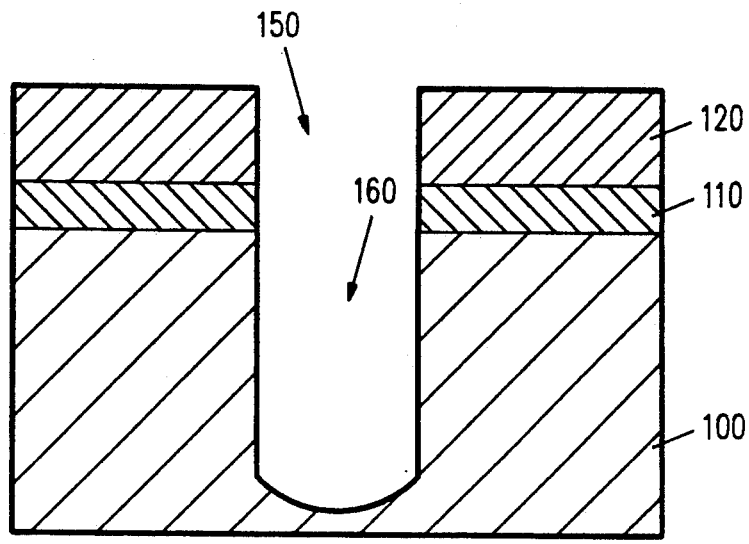
Figure 4:
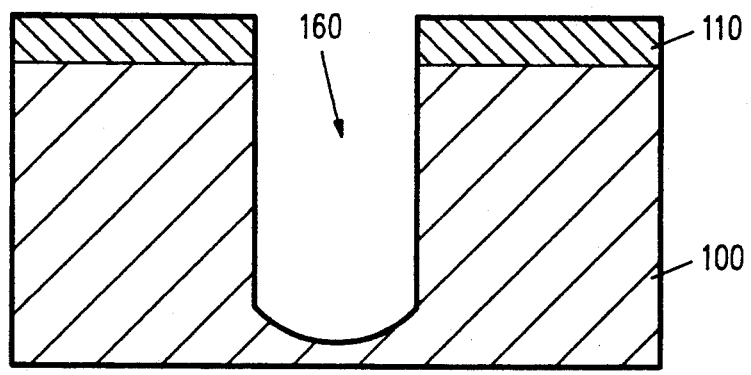

Refer now to FIG. 3. The substrate 100 is etched through the window 150 in the PLZT layer 120 and in the oxide layer 110 using, for example, a reactive fluorine etch to form trench 160. Standard fluorine-based or chlorine-based silicon etch techniques are suitable. Once the trench etch is complete, the PLZT layer 120 is removed using any suitable etchant. For example, sulfuric peroxide ($H_2SO_4/H_2O_2$) hydrogen fluoride (HF) and hydrogen chloride (HCl) dips are suitable. The resulting structure, which is shown in FIG. 4, has a deep trench 160 in silicon substrate 100, which is covered by the oxide layer 110. Processing of the structure of FIG. 4 proceeds as desired.

While the invention has been described with respect to the embodiments set forth above, the invention is not necessarily limited to these embodiments. For example, invention is not limited to any particular member or members of the lead perovskite family, and is not necessarily limited to the presence or absence of dopants or modifiers from materials of the lead perovskite family. Accordingly, other embodiments, variations and improvements not described herein are not necessarily excluded from the scope of the invention, which is defined by the following claims.

What is claimed is:

1. A method for etching a body using a fluorine or chlorine-based plasma etch, comprising the steps of:
   forming a first layer of material selected from the lead perovskite family over the body;
   forming a patterned masking layer over the first layer;
   forming a patterned first layer by etching the first layer through the masking layer; and
   etching the body through the patterned first layer using a fluorine or chlorine-based plasma.

2. A method as in claim 1 wherein said etching step is a reactive ion etch.

3. A method as in claim 1 wherein said etching step is performed in a parallel plate reactor.

4. A method as in claim 1 wherein said first layer forming step comprising the step of adding a dopant or modifier to the material selected from the lead perovskite family.

5. A method as in claim 4 wherein the dopant or modifier is lanthanum.

6. A method as in claim 1 wherein the masking layer comprises photoresist, and wherein the patterned first layer forming step comprises the step of etching the first layer through windows in the masking layer using a hydrogen fluoride (HF) or hydrogen chloride (HCl) dip.

7. A method as in claim 1 further comprising the step of forming a barrier layer over the body prior to said first layer forming step.

8. A method as in claim 7 wherein the barrier layer is silicon dioxide.

9. A method as in claim 1 further comprising the step, following said body etching step, of removing the first layer using a sulfuric peroxide ($H_2SO_4/H_2O_2$) hydrogen fluoride (HF), or hydrogen chloride (HCl) dip.

* * * * *